United States Patent [19]

Ogata et al.

[11] Patent Number: 5,020,010

[45] Date of Patent: May 28, 1991

[54] METHOD FOR PREPARING AND EVALUATING MEASUREMENT SPECIFICATONS FOR AN ELECTRONIC CIRCUIT

[75] Inventors: Teruaki Ogata; Yuko Sudou, both of Itami, Japan

[73] Assignee: Mitsubishi Denki Kabushiki Kaisha, Japan

[21] Appl. No.: 327,045

[22] Filed: Mar. 22, 1989

[30] Foreign Application Priority Data

Jan. 19, 1989 [JP] Japan .................................... 1-8681

[51] Int. Cl.⁵ .......................................... G01R 31/28
[52] U.S. Cl. .................................. 364/580; 364/489; 371/27
[58] Field of Search ............... 364/579, 580; 371/21.1, 371/20, 27

[56] References Cited

U.S. PATENT DOCUMENTS

| | | | |
|---|---|---|---|
| 4,070,565 | 1/1978 | Borrelli ................................ | 364/580 |
| 4,622,647 | 11/1986 | Sagnard et al. ..................... | 364/580 |
| 4,656,632 | 4/1987 | Jackson .............................. | 364/580 |
| 4,764,925 | 8/1988 | Grimes et al. ....................... | 371/27 |

FOREIGN PATENT DOCUMENTS 1133589  1/1985  U.S.S.R. ............................... 364/580

Primary Examiner—Felix D. Gruber
Attorney, Agent, or Firm—Leydig, Voit & Mayer

[57] ABSTRACT

A method of preparing measurement specifications is used in measuring the properties of an electronic circuit by means of a test facility which includes a measurement apparatus which operates in accordance with a measurement program including measurement specifications. The method includes the steps of preparing an overall testing peripheral circuit, an interface between the overall testing peripheral circuit and the measurement apparatus, and a measurement specification for each measurement item based on input signals, switch settings, and input/output signal paths of the overall testing peripheral circuit, activating the measurement apparatus in accordance with the measurement program to produce results for each measurement item, and correcting measurement specifications based on the result of the measurement and the measurement program.

7 Claims, 4 Drawing Sheets

METHOD FOR PREPARING AND EVALUATING MEASUREMENT SPECIFICATONS FOR AN ELECTRONIC CIRCUIT

BACKGROUND OF THE INVENTION

1. Field of the Invention

This invention relates to a method of inferring measurement specifications used in measuring the properties of electronic circuits such as semiconductor integrated circuits (hereinafter referred to as "IC(s)") by means of a measurement apparatus or the like.

2. Description of the Related Art

In general, after electronic circuits which are represented by IC's have been designed and manufactured, their properties are measured and tested by means of a measurement apparatus of the type which is called a general-purpose IC testing system. This type of measurement apparatus is generally equipped with a plurality of components such as signal generators and measuring devices, and is designed to activate these components in accordance with predetermined measurement programs, thereby enabling performance of various measurements and tests.

FIG. 6 is a block diagram schematically showing the overall arrangement used for measuring the properties of electronic circuits by means of such a measurement apparatus. A measurement apparatus 1 is connected to a measurement jig 3 by a connection cable 2. The measurement jig 3 includes an interface circuit 4 connected to the connection cable 2, a testing peripheral circuit 5, and a socket jig 6, and an IC 7 which is an object to be tested is connected to the socket jig 6. The testing peripheral circuit 5 includes a multiplicity of change-over switches (relays) so as to create peripheral conditions under which the IC 7 is actually used and to enable testing of the IC 7.

The measurement apparatus 1 is activated in accordance with a particular measurement program to input an electrical signal to the IC 7 through the interface circuit 4 and the testing peripheral circuit 5, thereby activating the IC 7. The output of the IC 7 is transferred to the measurement apparatus 1 through the testing peripheral circuit 5 and the interface circuit 4, and measured by the measurement apparatus 1. In this way, various tests on the IC 7 are performed on the basis of the particular measurement program.

The measurement jig 3 and the measurement program used for activating the measurement apparatus 1 are exclusively provided for the circuit design of the IC 7 to be tested, and have heretofore been prepared in accordance with the following procedure:

Step 1: Measurement items are selected on the basis of the device specifications prepared during designing of the IC 7 to prepare a measurement standard for the IC 7.

Step 2: An actual measurement method is examined.

Step 3: A measurement apparatus for use in measurement is selected on the basis of the result of the examination of Step 2.

Step 4: The testing peripheral circuit 5 and the interface circuit 4, both of which are required to make measurement as to all the measurement items of the IC 7 by using the measurement apparatus selected, are designed and the corresponding measurement specifications are prepared.

Step 5: The testing peripheral circuit 5 and the interface circuit 4 are produced, and they are connected to each other with the socket jig 6 connected to the testing peripheral circuit 5, thus preparing the measurement jig 3.

Step 6: A measurement program based on a language form used exclusively for the measurement apparatus 1 is prepared on the basis of the measurement specifications prepared in Step 4.

Step 7: The measurement jig 3 is connected to the measurement apparatus 1 by the connection cable 2, and the IC 7 is connected to the socket jig 6. The measurement apparatus 1 is activated in accordance with the measurement program in order to check whether the IC 7 is set under desired measurement conditions, and thus the output of the IC 7 is measured by the measurement apparatus 1.

Step 8: It is examined whether the measurement jig 3 and the measurement program need to be corrected by comparing the measurement data obtained in Step 7 with predetermined values.

Step 9: If it is determined from the examination of Step 8 that such a correction is needed, the measurement jig 3 and the measurement program are corrected.

In general, the operations of Steps 7-9 are called debugging, and the debugging is performed for each measurement item.

Step 10: After debugging as to all the measurement items has been completed, a plurality of IC's 7 are measured, and the correlations between the resultant measurement data and predetermined data as well as the stability and reproducibility of the result of the measurement are checked. Thus, standard values and the like for use in determining whether the quality of the IC 7 is acceptable are selected on the basis of the result of the confirmation.

Step 11: The measurement apparatus 1 is actually used to make measurements of the properties of the IC 7.

The properties of the IC 7 have heretofore been measured by the method including the above-described steps. In such a method, if the measurement jig 3 and the measurement program are corrected in Steps 7-9, the measurement specifications prepared in Step 4 must be corrected correspondingly. However, in order to check whether the measurement jig 3 and the measurement program correctly reflect the measurement specifications, a knowledge of both hardware and software of the measurement apparatus 1 is necessary and the checking requires a great deal of time. Furthermore, the conventional method has the problem that the qualities of the measurement specifications and the measurement program significantly depends upon differences among individual engineers in charge of debugging. In addition, the above method involves the problem that it is extremely difficult for any engineer other than a staff engineer in charge of debugging to check the measurement specifications.

SUMMARY OF THE INVENTION

It is, therefore, an object of the present invention to provide a method of inferring measurement specifications used in measuring electronic circuits, in which it is possible to efficiently debug a measurement jig and a measurement program and to easily check whether measurement specifications correctly correspond to the measurment jig and the measurement program.

In accordance with the present invention, there is provided a method of inferring measurement specifications used in measuring the properties of an electronic circuit by means of a measurement apparatus which operates in accordance with a measurement program including measurement specifications, the method comprising the steps of implementing measurement of the properties of the electronic circuit by activating the measurement apparatus in accordance with the measurement program, and inferring the measurement specifications based on the result of the measurement and the measurement program.

DESCRIPTION OF THE PREFERRED EMBODIMENT

An embodiment of the present invention will be described below with reference to the accompanying drawings.

Figure 1:
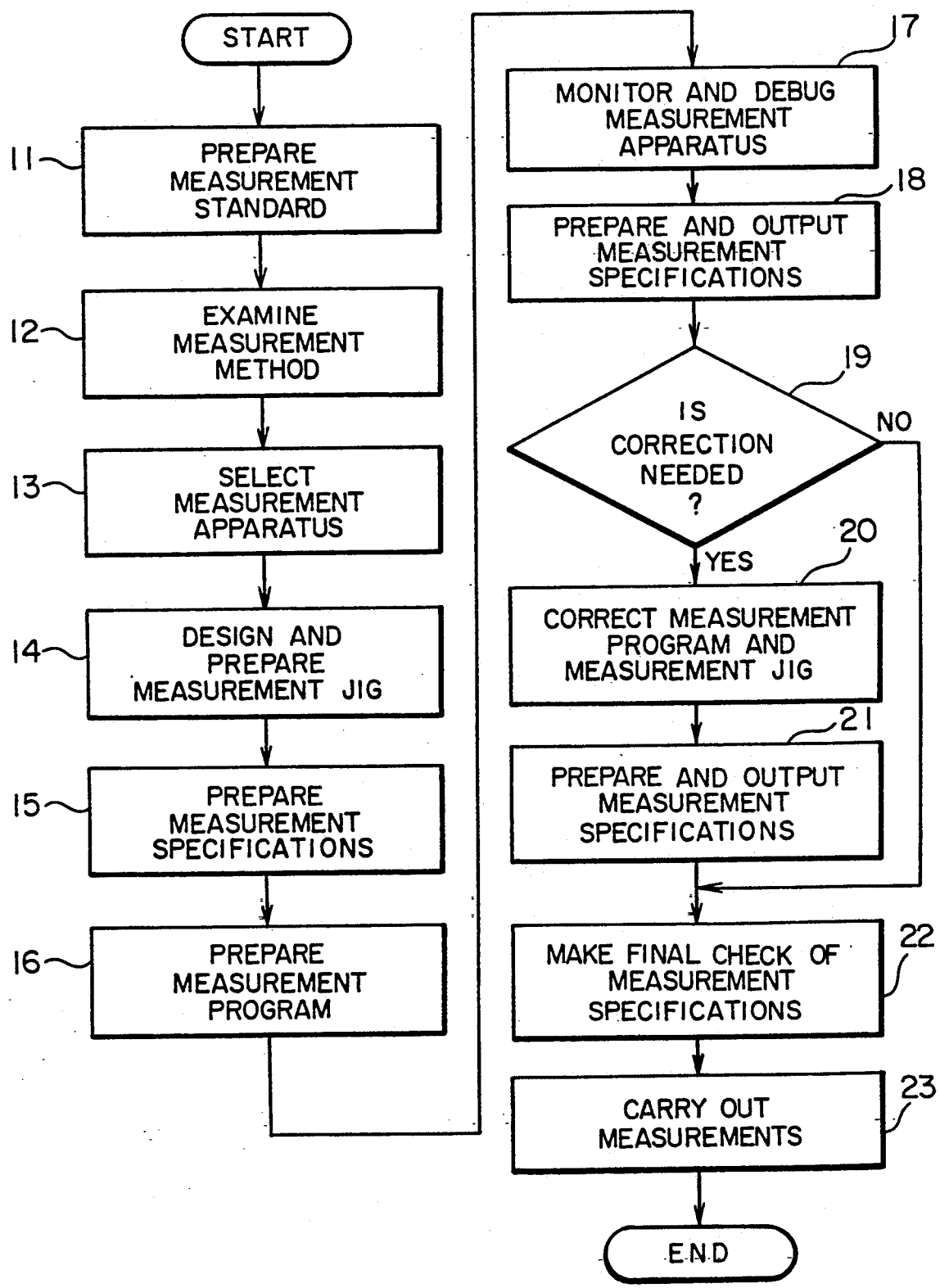
FIG. 1 is a flow chart showing a method of inferring measurement specifications according to an embodiment of the present invention.

Referring to the flow chart shown in FIG. 1, in Step 11, the requisite measurement items of an electronic circuit which is an object to be tested are selected and thus a measurement standard is prepared. In Step 12, it is determined what method is actually used to make measurements based on the measurement standard. In Step 13, a measurement apparatus suitable for use in the measurements is selected on the basis of the result of the determination.

Then, in Step 14, a measurement jig is designed. The measurement jig is needed to make measurements of the electronic circuit in accordance with all the measurement items by using the measurement apparatus selected. The measurement jig includes a testing peripheral circuit having the circuit required for assuring the normal performance of the function of the electronic circuit and a switching circuit for effecting switching of measurement conditions, and a family board section arranged to provide connection between the testing peripheral circuit and the measurement apparatus and to enable selection from among a plurality of input/output signal paths as well as to implement the requisite signal processing upon input and output signals. Incidentally, the family board section is of a standardized type which is not exclusively provided for the electronic circuit which is an object to be tested. The family board section is prepared in advance.

First, testing peripheral circuit diagrams for individual measurement items are prepared by adding previously standardized testing peripheral circuit modules, as required, to a general basic peripheral circuit diagram of the electronic circuit. Further, these testing peripheral circuits are synthesized with one another to prepare an overall testing peripheral circuit diagram which enables measurement of all the measurement items. Then, designing of an interface circuit for connecting the overall testing peripheral circuit to the hardware of the measurement apparatus is carried out. If it is necessary, at this time, to implement any processing, such as voltage amplification, onto the input or output signals of the electronic circuit, a standardized testing peripheral circuit module is inserted into a signal path in the family board section. Thus, the interface circuit is easily designed. In addition, a measurement jig including the thus-designed overall testing peripheral circuit and interface circuit is prepared and various kinds of data such as connection data for the signal paths and control data for switches in the measurement jig are registered in a data base (not shown).

In Step 15, the overall testing peripheral circuit diagram is compared to the testing peripheral circuit diagram for each individual measurement item, and input-/output signal paths, the state of setting of switches, conditions for application of voltage and current, and so forth, are added to the overall testing peripheral circuit diagram, thus preparing a measurement specification for each measurement item in the form of a figure and a tabulated measurement specification in which the measurement specifications for the respective measurement items are tabulated.

In Step 16, a measurement program using a language form which is provided exclusively for the measurement apparatus is prepared on the basis of the thus-prepared measurement specifications.

Then, in Step 17, the operation of the measurement apparatus is monitored for debugging purposes. More specifically, the measurement jig prepared in Step 14 is connected to the measurement apparatus, while the electronic circuit which is an object to be tested is connected to the measurement jig. In this state, while the measurement apparatus is being actually operated in accordance with the measurement program prepared in Step 16, the state of operation of the measurement apparatus with respect to each measurement item is observed. During this time, the measurement apparatus provides monitoring which is represented in a display form peculiar to the measurment apparatus.

In Step 18, measurement specifications and the results of measurements corresponding to the respective measurement items are prepared and output by combining the result of the monitoring, the overall testing peripheral circuit diagram prepared in Step 14, and the measurement program prepared in Step 16. The measurement specifications are displayed using a general language and a figure so that even an operator having no knowledge of the hardware or software of the measurement apparatus may understand the measurement specifications and so that the measurement specifications do not depend upon the kind of measurement apparatus.

Thereafter, in Step 19, it is determined whether correction of the measurement program and the measurement jig is needed, on the basis of the measurement specifications and measurement results that are output in Step 18. If the correction is needed, the process proceeds to Step 20, in which the measurement program and the measurement jig are corrected. Then, in Step 21, new measurement specifications for the respective measurement items are prepared from the corrected measurement program and the overall testing peripheral circuit diagram of the corrected measurement jig, and the measurement specifications are output. The measurement specifications which are thus output are also displayed using the general language and a figure.

In Step 22, a final check is made whether the measurement program and the measurement jig correctly reflect the measurement specifications which are output in Step 21.

On the other hand, if it is determined in Step 19 that no correction is needed, the process proceeds from Step 19 directly to Step 22, in which the aforementioned final check is made. After the measurement program, the measurement jig and the measurement specifications have been adjusted in this manner, measurements of the electronic circuit is carried out in Step 23.

A concrete example of the embodiment which is used to prepare measurement specifications is described below.

Figure 2:
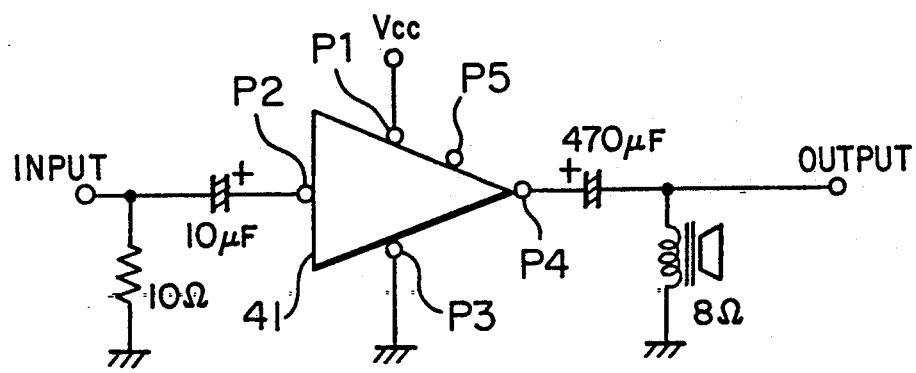
FIG. 2 is a circuit diagram showing an electronic circuit which constitutes an object to be tested in the embodiment, as well as the state of peripheral circuits of the electronic circuit when in use.
Figure 4:
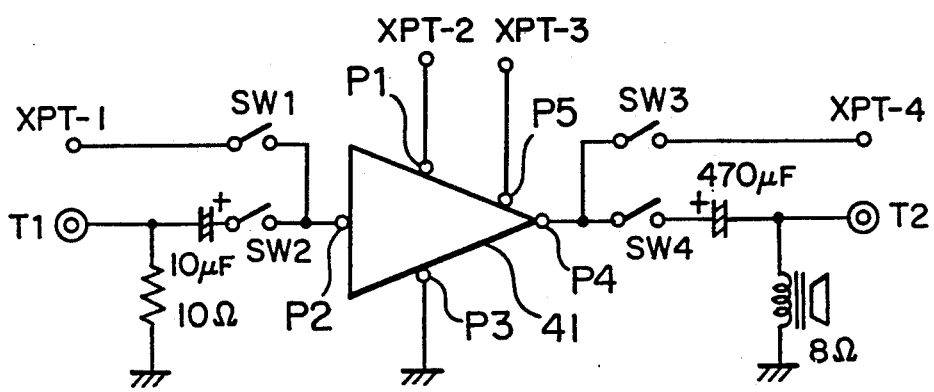
FIG. 4 is a circuit diagram showing an overall testing peripheral circuit.

FIG. 2 shows an IC 41 for sound amplification and the state of peripheral circuits of the IC 41 when in use. The IC 41 has five pins P1-P5 and, it is assumed that, for example, the measurement standard shown in the following Table 1 is prepared on the basis of the device specification of the IC 41.

another, then the overall testing peripheral circuit diagram shown in FIG. 4 is prepared. This overall testing peripheral circuit has a construction in which change-over switches SW1-SW4 and terminals XPT-1-XPT-4 are added to the peripheral circuit of FIG. 2, and is arranged to enable measurements corresponding to all the measurement items of Table 1.

Figure 3:
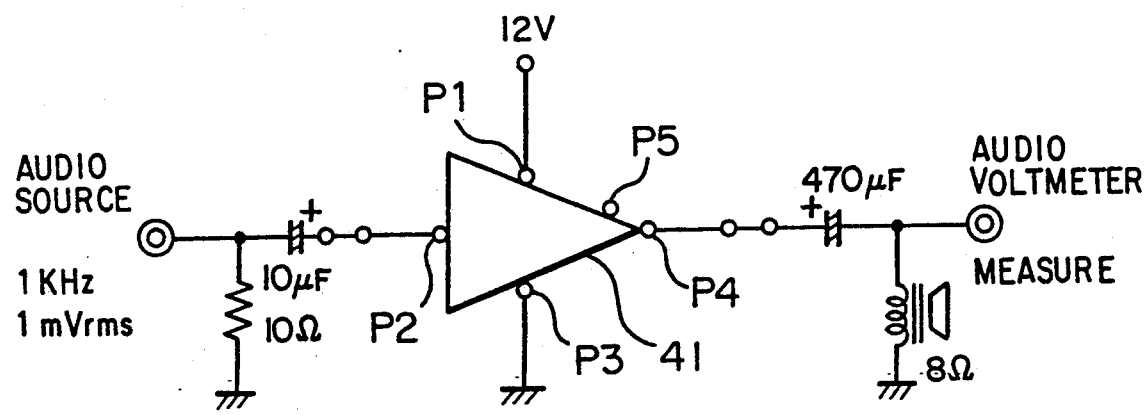
FIG. 3 is a circuit diagram showing a testing peripheral circuit corresponding to one measurment item.

Then, an interface circuit is designed, and connection data for the measurement jig as well as control data is registered. Thereafter, the testing peripheral circuit diagram of FIG. 3 is compared to the overall testing peripheral circuit diagram of FIG. 4 to display, on the overall testing peripheral circuit diagram, the measurement conditions shown on the testing peripheral circuit diagram, thereby providing the measurement specifications, shown in FIG. 5, for measurement of voltage gain. More specifically, in this measurement, the change-over switches SW1 and SW3 are switched off, while the change-over switches SW2 and SW4 are switched on. Simultaneously, a source voltage 12V is applied to the terminal XPT-2, while a voltage of 1 mVrms with 1kHz is applied through an input terminal

TABLE 1

Measurement Standard

| Symbol | Item | Measurement condition | Standard value Minimum | Standard | Maximum | Unit |
|---|---|---|---|---|---|---|
| Gv | Voltage gain | f = 1 kHz Vin = 1 mVrms | 43 | 46 | 49 | DB |
| THD | Total harmonic distortion | f = 1 kHz Vout = 1 mVrms | | 0.05 | 0.1 | % |
| Fb | Frequency characteristic | f = 10 kHz Vin = 1 mVrms | −0.3 | 0 | +0.3 | DB |
| Ni | Noise voltage in terms of input | Rg = 10 Kohm BPF = 20 Hz–20 KHz | | | 0.9 | mVrms |
| Pout | Maximum output | THD = 10% | 2 | | | W |
| Icc | Current in the absence of signal | | 20 | 32 | 40 | mA |
| V2 | Voltage at pin P2 | Voltage measurement during 10 μA application | 1.0 | 1.2 | 1.4 | V |
| V4 | Voltage at pin P4 | Voltage measurement during 10 μA application | 1.0 | 1.2 | 1.4 | V |
| NC5 | NC check at pin P5 | Voltage measurement during 10 μA application | 1.9 | 2.0 | 2.1 | V |
| LEAK2 | Leak current at pin P2 | Voltage measurement during 0.4 V application | −0.1 | 0.4 | 1.0 | μA |

A testing peripheral circuit diagram for each individual measurement item is prepared by adding testing peripheral circuit modules to the general basic peripheral circuit diagram of the electronic circuit on the basis of the above measurement standard. By way of example, FIG. 3 shows the testing peripheral circuit diagram which is prepared on the basis of the voltage gain which is one of the measurement items of Table 1. If the thus-prepared testing peripheral circuit diagrams for the respective measurement items are synthesized with one T1 to which an audio source (not shown) is connected. An audio voltmeter (not shown) is connected to an output terminal T2 to measure the voltage developed at the output terminal T2. In a similar manner, measurement specifications for the other measurement items are prepared, respectively.

When the measurement specifications for the respective measurement items are tabulated, a table of measurement specifications, such as Table 2, is obtained.

TABLE 2

Measurement Specifications

| Symbol | Item | Terminal condition XPT-1 | XPT-2 | XPT-3 | XPT-4 | Audio source | Change-over switch SW 1 | SW 2 | SW 3 | SW 4 | Audio volt-meter |
|---|---|---|---|---|---|---|---|---|---|---|---|
| Gv | Voltage gain | | 12 V | | | 1 kHz, 1 mVrms | off | on | off | on | Ⓜ |
| THD | Total harmonic distortion | | 12 V | | | adjusted to a 1 mVrms output at 1 kHz | off | on | off | on | Ⓜ |
| Fb | Frequency characteristic | | 12 V | | | 10 kHz, 1 mVrms | off | on | off | on | Ⓜ |
| Ni | Noise voltage in terms of input | | 12 V | | | off | off | on | off | on | Ⓜ |
| Pout | Maximum output | | 12 V | | | adjusted to 1 | off | on | off | on | Ⓜ |

TABLE 2-continued

| | | Measurement Specifications | | | | | Change-over switch | | | | Audio |
|---|---|---|---|---|---|---|---|---|---|---|---|
| | | Terminal condition | | | | | | | | | |
| Symbol | Item | XPT-1 | XPT-2 | XPT-3 | XPT-4 | Audio source | SW 1 | SW 2 | SW 3 | SW 4 | volt-meter |
| Icc | Current in the absence of signal | 12 V (M) | | | | kHz and THD 10% | off | on | off | on | |
| V2 | Voltage at pin P2 | 10 μA (M) | 12 V | | | | on | off | on | off | |
| V4 | Voltage at pin P4 | 1 V | 12 V | | | (M) | on | off | on | off | |
| NC5 | NC check at pin P5 | | 12 V | 10 μA (M) | | | on | off | on | off | |
| LEAK2 | Leak current at pin P2 | 0.4 V (M) | | | | | on | off | on | off | |

As described above, the measurement specifications are displayed in the form of a figure and a table, by using a general language or a figure. Accordingly, even an operator having no knowledge of the hardware or the software of the measurement apparatus can easily understand the measurement specifications.

Thereafter, a measurement program using a language form provided exclusively for the measurement apparatus is prepared on the basis of the above measurement specifications, and the operation of the measurement apparatus is monitored for debugging purposes. Since, during this time, the monitoring provided by the measurement apparatus is commonly represented in a display form peculiar to the measurement apparatus, it is difficult for an operator having no knowledge of the hardware or the software of the measurement apparatus to understand the meaning of the display. For this reason, measurement specifications and the results of measurements with respect to the respective measurement items are prepared and output by combining the result of the monitoring, the overall testing peripheral circuit diagram of FIG. 4, and the measurement program. The measurement specifications are displayed using a general language and a figure so that even an operator having no knowledge of the hardware or software of the measurement apparatus may understand the measurement specifications and so that the measurement specifications do not depend upon the kind of measurement apparatus. Accordingly, it is possible to very easily determine whether correction of the measurement jig and the measurement program is needed.

Figure 5:
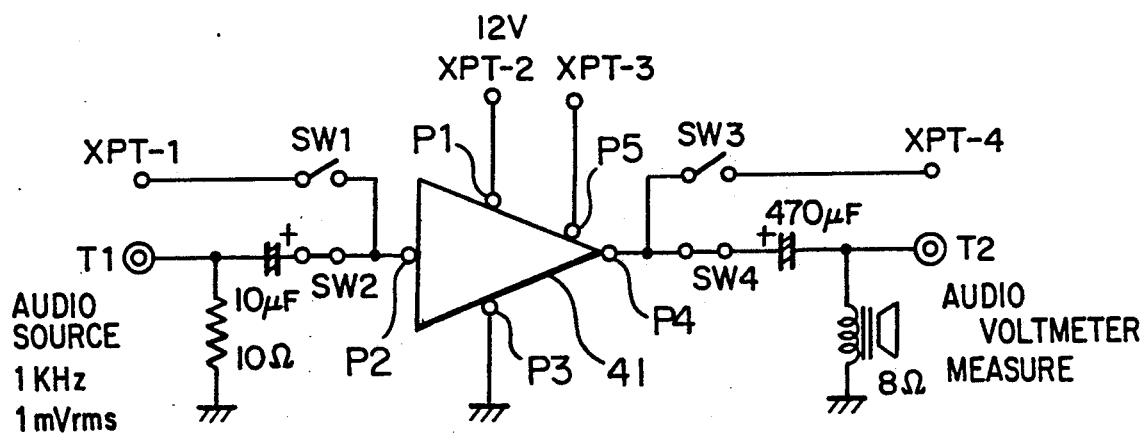
FIG. 5 shows a measurement specification corresponding to one measurement item.
Figure 6:
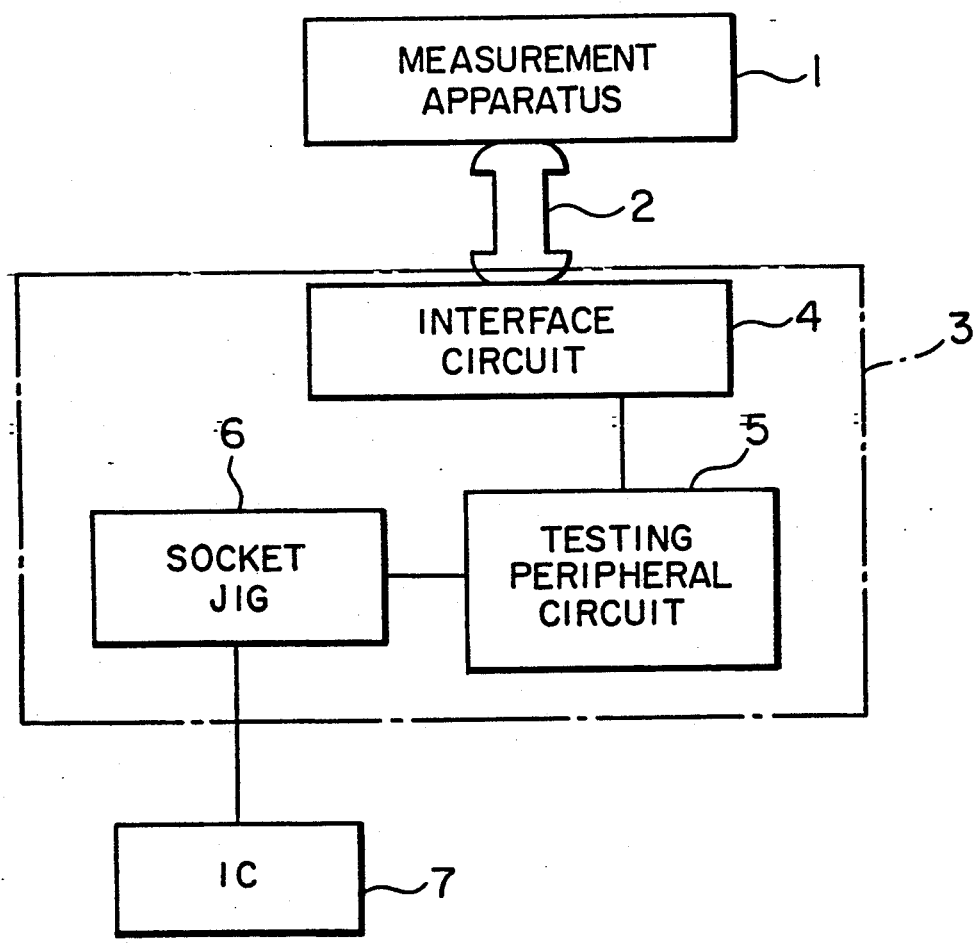
FIG. 6 is a block diagram showing a conventional apparatus for making measurements of electronic circuits.

On the basis of the decision, the measurement jig and the measurement program are corrected as required and new measurement specifications corresponding to the corrected measurement jig and the corrected measurement program are prepared with respect to the respective measurement items, and the obtained measurement specifications are output. The measurement specifications which are thus output are also displayed using a general language and a figure in a form similar to Table 2 or as shown in FIG. 5. Furthermore, after a final check has been made upon whether the measurement program and the measurement jig correctly reflect the measurement specifications, actual measurements of the IC 41 are carried out.

Incidentally, after the measurement program has been prepared in Step 16 of FIG. 1, the process may proceed directly to Step 18, in which the measurement specifications are prepared from the measurement program and the measurement jig and it may be checked whether the measurement program correctly reflects the measurement specifications. Thereafter, it may be examined whether correction is needed by monitoring the operation of the measurement apparatus for debugging purposes.

In addition, the method of this invention may be practiced using a measurement apparatus including a computer or, alternatively, using a conventional type of measurement apparatus and an external computer connected thereto. In the latter arrangement, the measurement apparatus serves to transfer the output of monitoring for debugging purposes to the external computer, and the measurement program and the measurement jig are converted into measurement specifications by the external computer.

What is claimed is:

1. A method for preparing measurement specifications for an electronic circuit on a test facility which includes a measurement apparatus and operates according to a language form in accordance with a measurement standard including at least one measurement item for testing the circuit by means of the measurement apparatus, said method comprising the steps of:

preparing an overall testing peripheral circuit including the circuit for which measurement specifications are to be prepared and at least one standardized testing peripheral circuit module corresponding to the at least one measurement item;

designing a measurement jig including the overall testing peripheral circuit and an interface for interfacing the overall testing peripheral circuit with the measurement apparatus;

preparing a measurement specification for each measurement item based on input signals, switch settings, and input/output signal paths of the overall testing peripheral circuit;

preparing a measurement program in the language form of the measurement apparatus on the basis of the measurement specification;

operating the measurement apparatus according to the measurement program to produce results of operation of the measurement apparatus with respect to each measurement item;

evaluating the results to determine whether correction of the measurement program or the jig is needed;

correcting the measurement program and the design of the measurement jig in accordance with needed corrections, if any, found by said step of evaluating; and preparing new measurement specifications based on the corrections, if any, made in said step of correcting.

2. A method according to claim 1 wherein said step of operating the measurement apparatus includes displaying the results of operation.

3. A method according to claim 1 wherein said step of operating the measurement apparatus includes displaying the results of operation in a general language and a figure.

4. A method according to claim 1 wherein said step of preparing new measurement specifications includes displaying the new measurement specifications.

5. A method according to claim 1 wherein said step of preparing new measurement specifications includes displaying the new measurement specifications in a general language and a figure.

6. A method according to claim 1 wherein said step of preparing a measurement specification includes preparing the measurement specifications in the form of a figure.

7. A method according to claim 1 wherein said step of preparing a measurement specification includes preparing the measurement specifications in the form of a table.

* * * * *